United States Patent [19]

Besson et al.

[11] 4,334,168

[45] Jun. 8, 1982

[54] HIGH FREQUENCY, THERMOSTATICALLY SELF CONTROLLED OSCILLATOR

[75] Inventors: Raymond J. Besson, Besancon; Jean P. Valentin, Pouilley les Vignes, both of France

[73] Assignee: Etat Francais, Paris, France

[21] Appl. No.: 166,907

[22] Filed: Jul. 8, 1980

[30] Foreign Application Priority Data

Jul. 19, 1979 [FR] France ................. 79 18553

[51] Int. Cl.³ ............................................ H01L 41/08
[52] U.S. Cl. ................................. 310/343; 310/349; 310/344; 236/1 F
[58] Field of Search ........................ 310/341–344, 310/347, 349, 369; 331/69, 70; 219/210; 236/1 F

[56] References Cited

U.S. PATENT DOCUMENTS

| | | | |
|---|---|---|---|
| 2,047,387 | 7/1936 | Scott | 310/349 |
| 2,078,229 | 4/1937 | Bokovoy et al. | 310/349 |
| 2,123,236 | 7/1938 | Fair | 310/349 |
| 2,284,088 | 5/1942 | Gerber | 310/349 X |
| 4,135,108 | 1/1979 | Besson | 310/349 X |
| 4,259,606 | 3/1981 | Vig | 310/343 |

*Primary Examiner*—Mark O. Budd
*Attorney, Agent, or Firm*—Stevens, Davis, Miller & Mosher

[57] ABSTRACT

An autothermostatic high frequency oscillator comprising a piezoelectric resonator of the type having electrodes which are not adhered to the crystal. The contact between the part of the crystal 1 serving to support the vibrating part of the crystal and the dielectric plates 2,3 supporting the excited electrodes is limited to a discontinuous surface of reduced scope constituted by a finite number of elements of contact surface. At least an infra-red reflector screen (200) located at the very interior of the water tight cavity (400) surrounding the resonator is situated immediately adjacent said resonator and the electric power applied to the excited electrodes is at least in the range of about 50 microwatts. The invention permits one to achieve oscillators with small consumption of energy and high stability.

21 Claims, 6 Drawing Figures

HIGH FREQUENCY, THERMOSTATICALLY SELF CONTROLLED OSCILLATOR

The object of this invention is to provide a high frequency, thermostatically self-controlled, oscillator of the type that comprises a piezoelectric resonator mounted in a sealed container composed of at least one piezoelectric crystal provided with a continuous peripheral section forming a ring connected to a central section by an intermediate zone which is recessed over the greater part of its area and comprises at least two connecting bridges to hole the central section and the peripheral section solidly together, and two dielectric plates to hold and maintain the exciting electrodes without contact with, and respectively opposite, each of the sides of one of the central and peripheral sections which then constitutes the active vibrating part of the crystal; the other part of the crystal which constitutes part of the support of the crystal is maintained in position between the said dielectric plates.

In oscillators that make use of quartz crystal piezoelectric resonators, there is a tendency to feed the crystal exciting electrodes with very low powers, between about 0.1 $\mu$W and some 20 microwatts and generally near to 5 $\mu$W, in order to reduce drift and frequency deviation and even risks of the crystal exploding. The resonator is placed, at the same time, in a thermostat of very high precision in order to limit, to a maximum, fluctuations of temperature of the crystal which always has a repercussion on oscillation frequency.

The object of this invention, among others, is to provide an oscillator of high precision which increases the insensitivity of the resonator to fluctuations of external temperature while greatly limiting the overall expenditure of energy required for operation of the oscillator and, mainly, the energy expanded in the thermostat in which the oscillator is placed.

These objects are attained by means of an oscillator of the type mentioned above in which, in conformity with the invention, contact between the support section of the crystal and the two dielectric plates is limited to a discontinuous area of small size composed of a finite number of contact surface elements, at least one infra-red reflecting screen is placed inside the sealed container in the immediate vicinity of the piezoelectric resonator and the electric power applied to the energising electrodes is at least 50 microwatts approximately.

The finite number of contact surface elements of the crystal support section may be four, for example.

The electric power applied to the exciting electrodes provided in-depth internal heating of the active part of the resonator by means of the power consumed in the motionable resistance of the crystal. Because the active part of the crystal is insulated from the support plates because of the existence of a limited number of thin connecting bridges between the active part of the crystal and the part that forms a support, and a limited number of contact surface elements between the support part of the crystal and the dielectric plates, and because of the presence of at least one infra-red electro-magnetic screen, in the immediate vicinity of the resonator, heat losses by radiation and conduction are limited and the piezoelectric crystal can be kept at its inversion temperature basically by means of the heat dissipated in the active part of the crystal by vibration which produces in-depth internal heating of the reference crystal. The oscillator can consequently be installed in a thermostat of very low precision that consumes little energy. Globally, this invention provides an appreciable economy of energy because the electric power, of the order of 1 milliwatt for example, is sufficient to maintain the crystal at its inversion temperature, whereas the traditional methods that consists of maintaining the temperature of the crystal by means of the external ambient temperature regulated by a high-precision thermostat requires a power of several watts. Above all, heating of the crystal by internal vibration drives a flow of heat towards the exterior of the crystal maintained always in the same direction. This property, added to the fact that the crystal is heated in depth and not only on the surface, increases the temperature stability of the crystal and its insensitivity to external fluctuations, for example to daily variations. Frequency drifts are therefore extremely reduced in spite of the high level of electrical energy applied to the electrodes. For example, a drift of $3.3 \, 10^{-10}$ Hz/day can be obtained for a quartz resonator of 5 MHz, P5, cut AT, operating at a power of 1,600 microwatts.

According to the specific features of this invention, the parts of the internal sides of the dielectric plates situated opposite the crystal but not covered with electrodes and not in contact with the crystals, are polished and covered with an infra-red electromagnetic screen.

The external surfaces of the dielectric plates are polished and covered with an infra-red electromagnetic screen.

The support part of the crystal is polished and covered with an infra-red electromagnetic screen.

The infra-red electromagnetic screens may consist of a deposit of metal such as gold, silver or copper or may consist of multi-layer reflector elements corresponding to one quarter wave length for infra-red radiation.

The presence of an electromagnetic screen deposited on the dielectric plates themselves and/or on the support part of the crystal substantially increases the efficiency of the internal heating in the active part of the crystal and effects a veritable confinement of the infra-red energy for emissions of energy by the resonator is limited to the minimum.

The thermostatically self-controlled oscillator, according to the invention, comprises a temperature sensor placed in the immediate vicinity of the wall of the sealed container surrounding the piezoelectric resonator and facilities are provided to regulate the electric power fed to the electrodes deposited on the dielectric plates as a function of signals transmitted by the sensor.

According to a particular method of construction, the exciting electrodes that produce an electrical field in the active part of the piezoelectric crystal receive, firstly, electric power to excite the crystal in conformity with a mode selected to determine a frequency reference and, secondly, electric power greater or equal to 50 microwatts approximately to energise the crystal in accordance with a mode, or a partial, or an anharmonic vibration different from the mode selected to determine a frequency reference.

This characteristic is particularly advantageous because the electric power that excites the crystal in order to provide a frequency reference, may be adjusted to a value at which aging is practically nil while the vibration of the crystal in a different mode, not used as frequency reference provides extra internal heating of the active part of this crystal insofar as coupling with the basic vibration is sufficiently weak.

It is thus possible to choose, for the basic vibration, a mode for which the crystal quality coefficient is excellent and, for auxiliary heating vibration, another mode for which the crystal quality coefficient is less. By adjusting the exciting power of the basic vibration, which itself has a very high quality coefficient, to an optimum value at which aging is practically nil, long term stability can be excellent. The auxiliary vibration, in this case, provides a means of completing internal heating of the crystal to easily reach the inversion temperature and is all the more advantageous in that the quality coefficient of the said auxiliary vibration is lower.

When a plurality of different vibration modes are utilised, several different electrode systems can be used but, in the event that electronic selection is effected by filtering, one pair of electrodes only is sufficient.

A plurality of electromagnetic screens inside or outside the sealed container may be used to increase the confinement of electromagnetic energy in the crystal.

In certain cases, traditional means of auxiliary heating may also be added to the device covered by the invention in order to benefit by a reduced temperature rise time and, simultaneously, by extremely low energy to maintain the crystal temperature.

Other features and advantages of this invention will appear as the description is read, a description which follows the particular applications of the invention and refers to the appended drawings in which.

Figure 1:
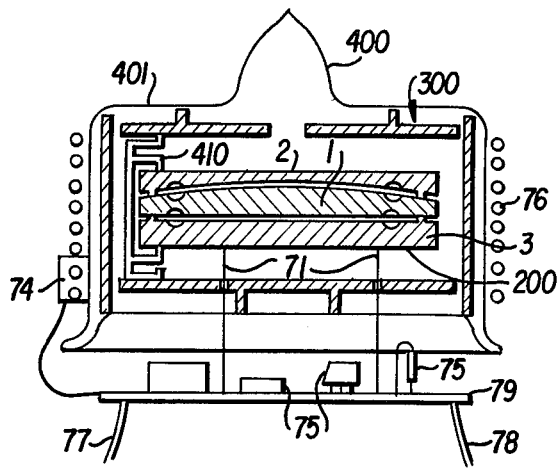
FIG. 1 is a schematic cross section of a particular application of the invention.

FIG. 1 schematically illustrates an oscillator consisting of, firstly, electronic circuits 75 fitted on a mounting 79 and, secondly, an assembly forming a resonator which is disposed inside a sealed container 400. The sealed container 400 may consist of, for example, a metal cover 401 which is polished and gold plated on its two sides in order to provide a good reflecting capacity, and a base 402 which may also be made of metal but which is, in the example of FIG. 1, preferably made of an insulating alumina plate.

An electromagnetic screen 300 adapted to reflect mainly infra-red rays, is disposed in the interior of container 400. The screen 300 consists preferably of insulating plates made of material of low heat conduction capacity, on which a reflecting surface has been deposited. The screen 300 can consist of a plurality of plates mounted on cover 401 or base 402 of container 400.

The resonator itself basically consists of a piezoelectric crystal 1 and two dielectric plates 2,3, designed to carry exciting electrodes which have to be placed at a very short distance from crystal 1, but not in contact with it. The resonator 1,2, 3, which is shown in greater detail in FIG. 4, is mounted inside container 4 and screen 300 by means of clamps 410 adapted to hold the assembly 1,2,3, in position, while limiting heat transmission by conduction.

Figure 4:
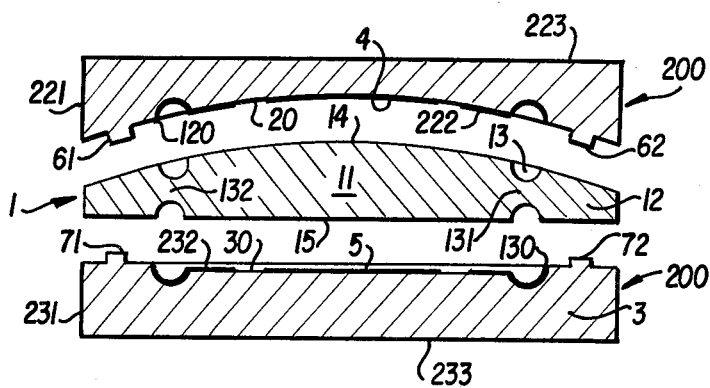
FIG. 4 is an enlarged axial cross section of the part of the devices shown in FIGS. 1 and 2 that constitute a resonator.
Figure 3:
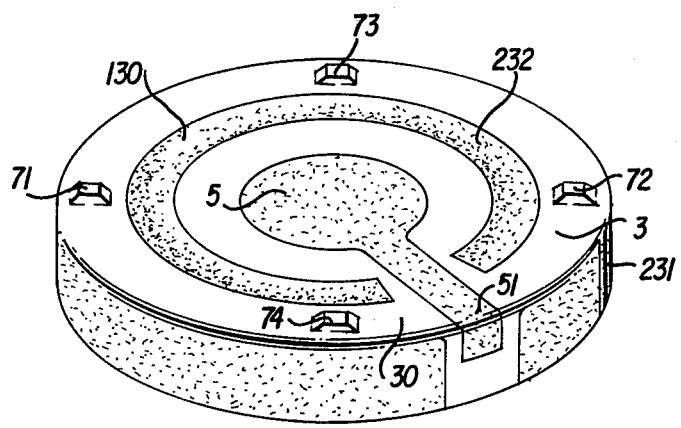
FIG. 3 is a perspective view of an electrode support plate that complies with the invention.

An electromagnetic screen 200, which will be described in greater detail when referring to FIGS. 3 and 4, is placed in the immediate proximity of resonator 1,2,3, and preferably, is solid with the resonator. The basic structure of the piezoelectric resonator 1,2,3, is of non-adherent electrode type as is described, principally, in the French patent application No. 2 338 607. Thus, a piezoelectric crystal 1, for example a quartz crystal, consists of a central section 11, connected to a peripheral section 12 by a limited number of connecting bridges 131, 132, 133, 134 (FIGS. 4 to 6) of which the thickness is preferably reduced in relation to the thickness of both the central section 11 and of the peripheral section 12. It is particularly important, within the scope of this application, that the thickness and/or width of connection bridges 131 to 134 be very limited in order to reduce transmission of heat by conduction between the active part of the crystal and the part that forms a support, to a minimum. A number of connection bridges equal to four constitutes an optimum whereas a single bridge consisting of an intermediate zone 13 which is thinned down between the central section 11 and peripheral section 12 but which has no recessed part, is to be excluded from the scope of this invention.

In the arrangement shown in FIGS. 3 to 6, electrodes 4 and 5 are deposited on the internal surfaces 20, 30 of dielectric plates 2 and 3 respectively, opposite sides 14 and 15 of crystal 1, on the level of the central section 11 which is therefore the vibrating active section. In conformity with a specific feature of the invention, section 12 of crystal 1 which constitutes the crystal support section, is only in contact with plates 2 and 3 by a discontinuous surface of small size constituted of a finite number of contact surface elements such as 61, 62 or 71, 72, 73, 74. Contact surfaces such as 71 to 74 (FIG. 3) may easily be provided by, for example, chemical action on surface 30 of plate 3, if contact points 71 and 74 have been given prior protection against the chemical action by, for example, deposit of protective resins on surface 30. It is advantageous that the contact surface elements such as 61, 62, 71 to 74 be regularly distributed in relation to the peripheral section 12, with which they cooperate, and be of limited number, for example, three elements or preferably four elements 71 to 74 on each support plate, laid out in the form of a cross.

In conformity with a major feature of this invention, a reflecting screen 200 is deposited on the resonator 1, 2, 3 itself. The screen 200 may consist of a metal deposit such as gold, silver or copper, for example. Nevertheless, non-metallic multi-layer deposits corresponding to a quarter wave length for infra-red radiation, may also be used as reflecting screens. Metal or multi-layer deposits are, in all cases, applied to surfaces which are previously polished. It may be seen from FIGS. 3 and 4 that screen 200 is composed of a series of deposits applied to the various sides of plates 2 and 3. Deposits 222 and 232 are applied on the internal sides, 20 and 30 of plates 2 and 3 in the zones which are free of electrodes and which are not support zones, that is to say, mainly between contact surface elements such as 61, 71 and electrodes, 4, 5. Layers 222, 232 which are in the immediate vicinity of the vibrating active central section 11 of crystal 1, play a preponderant part in the concentration of heat transmitted by section 11 of crystal 1.

The external reflecting layers 221, 223 and 231, 233 applied on the outsides of plates 2 and 3, also basically contribute, by the container which they form around the resonator, to confinement inside the resonator of the heat developed in the vibrating section of crystal 1. Plates 2 and 3 with their reflecting layers 221, 223, 231, 233 can only, in fact, transmit an extremely limited quantity of radiation to the exterior and thus contribute to preventing evacuation of the heat that is generated in crystal 1.

Figure 5:
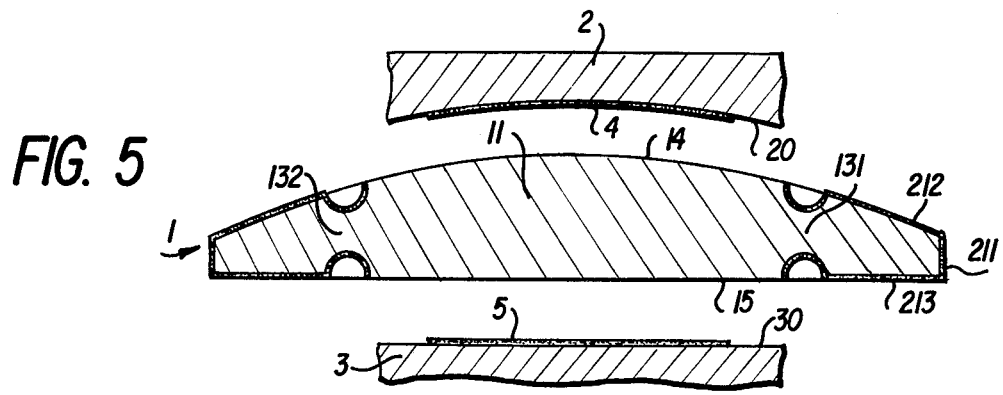
FIG. 5 is a cross section of a variant, along line V—V of FIG. 6.
Figure 6:
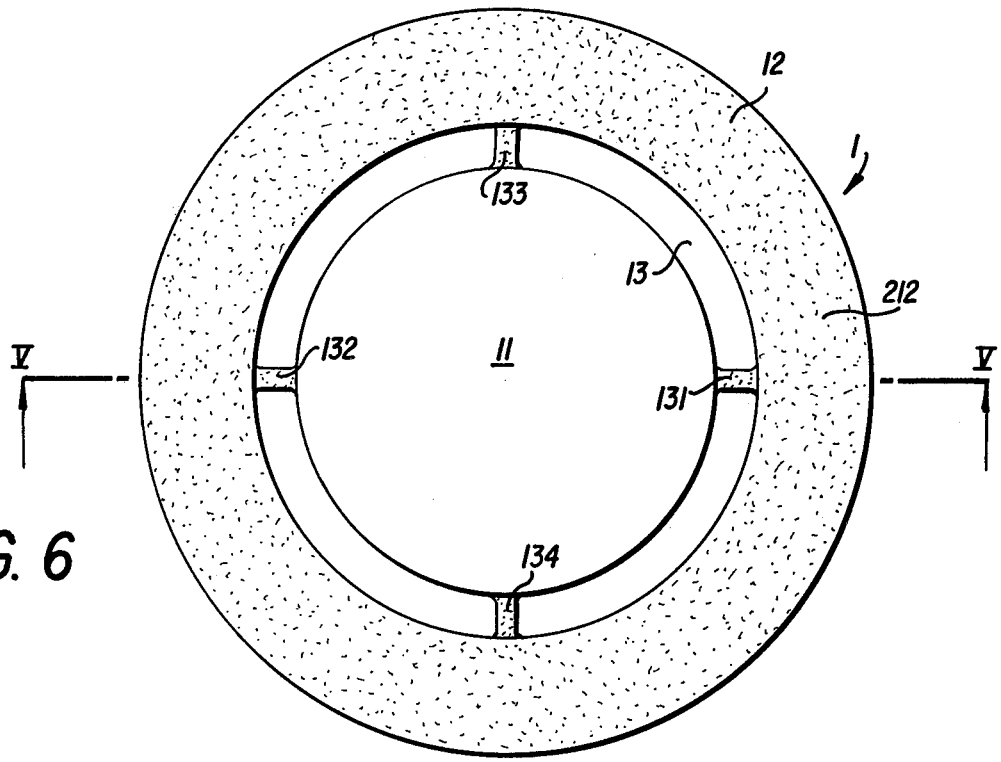
FIG. 6 is a view from above of an example of a piezoelectric crystal utilisable within the scope of the invention.

The variant of application illustrated in FIGS. 5 and 6 shows that a reflecting deposit 211, 212, 213, that forms part of screen 200 can be applied to the crystal itself, on the inactive sections distant from the active vibrating central section. The cut side of crystal 1 can thus be covered after it is polished, by a layer 211 similar to layers 221 or 231, for example. The sides 14 and 15 of the crystal can also be covered by layers 212, 213 forming a reflecting screen in section 12 and, possibly, the intermediate connecting section 13 provided with bridges 131, 132, 133 and 134. Radiation from crystal 1 itself is then extremely limited without the qualities of the crystal being affected, since the active vibrating section 11 remains free from any electrode deposit or reflecting coat.

The operation of the oscillator in conformity with the invention will now be explained in detail.

As is known, the piezoelectric crystal of a resonator designed to provide a frequency reference must be raised to its inversion temperature and maintained rigorously at this temperature which is higher than ambient temperature for the long term stability of the system to be the best possible. The rise of temperature and, above all, the maintenance of temperature are provided, in conformity with the invention, basically by internal heating of the active sections of the resonator crystal by the power consumed by the motional resistance of the crystal.

This is possible because of the fact that, firstly, part of the power applied to the resonator exciting electrodes is particularly high, that is to say, at least 50 microwatts approximately and can be of the order of a few milliwatts and, secondly, the resonator is itself insulated from the exterior by at least one, or several, electromagnetic screens.

The setting of the crystal inversion temperature is thus effected by adjusting the electric power supply to the resonator. This adjustment may be effected automatically by adjusting the electric power as a function of the exterior temperature of a reference point located in the vicinity of the resonator, but which may be outside container 400. The reference point may thus be, for example, located on container 400 and a sensor 74 located at this point enables the power supply to the resonator electrodes to be controlled by external temperature fluctuations and thus to maintain a constant temperature for the crystal itself. The fact that the crystal is thus heated in depth and becomes thermally active since it is raised to a temperature higher than the outside temperature favourises operational stability because the temperature gradient is always in the same direction, contrary to the case when the crystal is heated by supply of heat from outside. Maintenace of the crystal temperature thus remains much more independent of outside variation of temperature and it is possible to use an auxiliary thermostat of relatively mediocre quality.

In another connection, it has been noted that the aging of a resonator depends on the power under which it operates and becomes nil at a certain value for power which depends on the type of crystal used. There is thus a particular interest in feeding the resonator with a power which, for the effective vibration utilised, is adjusted to a value near to the power at which aging is nil. In the event that this power is insufficient to completely heat the whole active section of the crystal and raise it to the inversion temperature, it is then possible to make use of another vibration of the crystal which is not used as a frequency reference, to take part in raising the temperature of the crystal. This other vibration may be an anharmonic vibration, a vibration in a different partial or in a different mode. This supplementary vibration that serves exclusively for heating, may be applied with a power between 50 microwatts approximately and 1 milliwatt although this last figure may be greatly exceeded.

In conformity with a first application, the supplementary heating vibration is applied by means of a pair of additional electrodes superimposed on the main electrodes 4 and 5 and insulated from them, or disposed laterally with respect to electrodes 4 and 5 on plates 2 and 3 but always in the vicinity of the central active section 11 of the crystal.

In conformity with another application, only one pair of electrodes 4,5, is deposited on the dielectric plates 2,3 opposite the active section 11 of the crystal to excite this active section in an effective mode of frequency reference and in an additional heating mode, and electronic circuits 75 of the oscillator comprise filtering circuits to isolate the effective component of the reference frequency of the electric signal applied to the electrodes. The configuration of the resonator thus remains particularly simple in this case.

A number of examples of utilisable vibration modes and of maximum power to be implemented, will be given below, as a function of the diverse types of crystals.

With an AT-cut quartz crystal, dimensioned and excited to vibrate at 5 MHz in partial mode 5, the electric power supplied to the electrodes to excite the active section of the crystal in partial mode 5 for aging to be as low as possible must lie between 70 and 110 microwatts approximately.

With an SC-cut quartz crystal, dimensioned and excited to vibrate at 5 MHz in mode C and partial mode 3, the electric power supplied to the electrodes to excite the active section of the crystal in mode C and partial mode 3, for aging to be as low as possible, must lie between 140 and 180 microwatts approximately.

With this type of quartz and also, more generally, with double-rotation quartz crystals, it is possible to use an additional vibration to heat or excite the crystal to make it vibrate in mode B. Insofar as the additional vibration is not taken into account as a frequency reference, aging does not occur and the electric power fed to the electrodes to excite the active part of the crystal in mode B may, without inconvenience, be of the order of a few hundredths or thousandths of a microwatt and, for example, near to 1500 microwatts.

In general and for a crystal having a good quality coefficient in the first partial mode and a lesser quality coefficient in another partial mode, there is advantage in using, firstly, the first partial mode to obtain a frequency reference and to supply, at the same time, at least part of the crystal heating and, insofar as the coupling is not excessive between the two vibration modes, in utilising another part of the second partial mode to provide additional heating of the crystal which will be all the more efficient in that the motional resistance of this second partial mode is, generally, higher.

The stability of an oscillator that complys with the invention, in all cases, will be proportional to the difference of temperature between the crystal itself and the outside ambient temperature. The oscillator with its internal heating system by vibration applied to the crystal, will therefore be advantageously placed in a low-temperature ambience, for example in liquid nitrogen, in the event that exceptional functional stability is required.

Traditional means of increasing the temperature of the crystal may however be added to the oscillator described above in order to play an essential part in startup and accelerating the rise of crystal temperature to inversion point, principally, for the said inversion temperature is then maintained preponderantly, as has been stated above, by means of the heat generated in the crystal by its own vibration. The traditional means of raising the crystal temperature, designed to be able to supply an energy of a few joules on startup of the system, may include an electric resistance 76 outside container 400 or, depending upon the applications, an internal resistance composed of a resistive layer which is not illustrated, deposited on plates 2, 3 of electrode mounting 4, 5. Even in the event that these traditional means of raising temperature are used as auxiliaries, the dependency of the resonator frequency on temperature is greatly attenuated as soon as the electric power applied to the resonator excitation electrodes, for frequencies of the order of a few magahertzs, is greater than approximately 50 microwatts and is not too far, for the effective vibration, from the optimum figure at which aging is nil.

The flow of heat emitted by the crystal, in all cases, must be limited when working continuously. For this purpose, particular care must be taken in insulating the container or containers surrounding the resonator.

Figure 2:
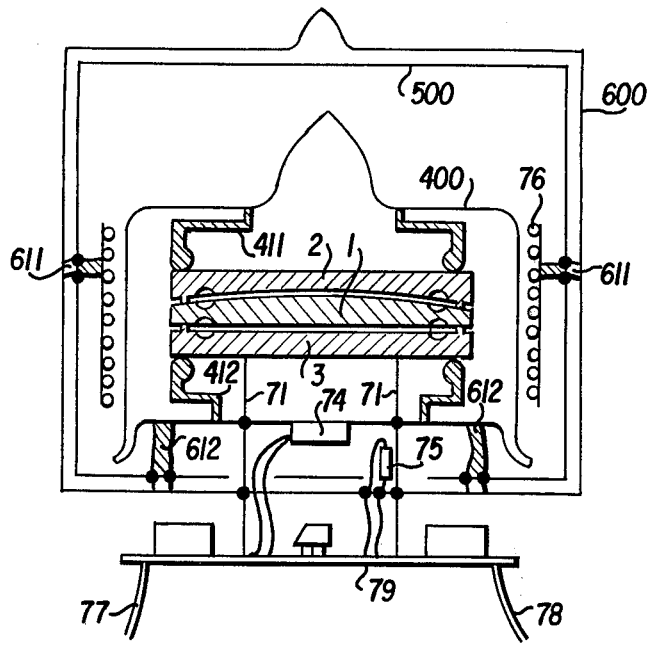
FIG. 2 is a schematic cross section of another application of the invention.

In the application illustrated in FIGS. 1 and 2, the electrodes deposited on plates 2, 3 are connected to circuits 75 by connecting wires 71 which are preferably heated by very low powers, of the order of 10 mW, to raise them to a temperature of the order of the crystal inversion temperature and to thus limit losses of heat towards the exterior. The heating of connecting wires 71 can, moreover, be easily effected by means of the heat losses alone due to the elements of circuit 75, insofar as the latter are placed in the immediate vicinity of container 400.

The efficiency of the system can be increased if, as in the case of the application illustrated in FIG. 2, a number of reflecting screens such as 500, 600 are disposed outside the first container 400 and if a vacuum is created inside containers 500, 600 with the containers connected together by insulating studs 611, 612. Clamps 411, 412 that hold resonator 1, 2, 3 in container 400 are also made of an insulating material. In the event that the application illustrated in FIG. 2 in which several electromagnetic screens are placed outside container 400, the inside screen such as 300 which is present in the application shown in FIG. 1 may be eliminated but it remains important, in this case, that the resonators be surrounded by screen 200 placed on plates 2, 3 themselves.

A number of modifications and additions may be applied to the devices which have just been described, by an expert. Thus, in conformity with a variant, electrodes 4, 5 may not be totally separate from layers 200 forming a screen and deposited on plates 2, 3 and/or the crystal 1 and one of the electrodes may, in this case, be at the same reference potential as the said parts of screen 200.

We claim:

1. High frequency, thermostatically self-controlled, oscillator of a type that comprises a piezoelectric resonator mounted in a sealed container and composed of at least one piezoelectric crystal provided with a continuous peripheral section that forms a ring connected to a central section by an intermediate zone which is recessed over the greater part of its area and comprises at least two connection bridges to connect the central section and the peripheral section solidly together, and two dielectric plates to hold and maintain the exciting electrodes, without contact with, and respectively opposite, each of the sides of one of the central and peripheral sections which then constitutes the active vibrating part of the crystal, the other part of the crystal that constitutes a support part for the crystal is maintained in position between the said dielectric plates, characterised by the fact that the contact between the top part of the crystal and the two dielectric plates is limited to a discontinuous surface of reduced extent composed of a finite number of contact surfaces elements, by the fact that at least one infra-red reflecting screen is disposed inside the sealed container in the immediate vicinity of the piezoelectric resonator, and by the fact that the electric power applied to the exciting electrodes is at least 50 microwatts approximately.

2. Thermostatically self-controlled oscillator, in conformity with claim 1, characterised by the fact that the finite number of contact surface elements of the support part of the crystals is equal to four.

3. Thermostatically self controlled oscillator according to claim 1 characterised by the fact that the parts of the internal sides of the dielectric plates located opposite the crystal but not covered by electrodes and not in contact with the crystal, are polished and covered with an infra-red electromagnetic screen.

4. Thermostatic self-controlled oscillator, in conformity with any of claims 1 to 3, characterised by the fact that the external sides of the dielectric plates are polished and covered with an infra-red electromagnetic screen.

5. Thermostatically self-controlled oscillator, according to claim 1, characterised by the fact that the support part of the crystal is polished and covered with an infra-red electromagnetic screen.

6. Thermostatically self-controlled oscillator, in conformity with one of claims 1 to 5, characterised by the fact that the infra-red electromagnetic screen or screens, consist of a metallic deposit of gold, silver or copper.

7. Thermostatically self-controlled oscillator, according to claim 6, characterised by the fact that the electromagnetic screens are composed of multi-layer reflecting elements corresponding to one quarter wave length for infra-red radiations.

8. Thermostatically self-controlled oscillator in conformity with claim 1, characterised by the fact that it comprises a temperature sensor disposed in immediate proximity to the wall of the sealed container surrounding the piezoelectric resonator, and by the fact that means are provided to regulate the electric power fed to the electrodes deposited on the dielectric plates as a function of signals transmitted by the sensor.

9. Thermostatically self-controlled oscillator, in conformity with claim 1, characterised by the fact that the exciting electrodes generate an electric field in the active part of the piezoelectric crystal that receives, firstly, an electric power greater than or equal to 20 microwatts approximately to excite the crystal in accordance with an effective mode chosen to determine a frequency reference and, secondly, an electric power greater than or equal to 50 microwatts approximately to excite the crystal in accordance with a mode, a partial or an anharmonic vibration different from the effective mode chosen to determine a frequency reference.

10. Oscillator, in conformity with claim 9, in which the piezoelectric crystal is of AT cut and is dimensioned and excited to vibrate at 5 MHz in partial mode 5, characterised by the fact that the electric power fed to the electrodes to excite the active part of the crystal in partial mode 5, lies between approximately 70 microwatts and 110 microwatts.

11. Oscillator, according to claim 9, in which the piezoelectric crystal is of cut SC and is dimensioned and excited to vibrate at 5 MHz in mode C and in partial mode 3, characterised by the fact that electric power fed to the electrodes to excite the active part of the crystal in mode C and in partial mode 3, lies between approximately 140 microwatts and 180 microwatts.

12. Oscillator, in conformity with claim 11, characterised by the fact that the crystal of cut SC is, also, excited to vibrate in mode B, and by the fact that the electric power fed to the electrodes to excite the active part of the crystal in mode B is of the order of approximately a few hundredths of microwatts.

13. Oscillator, in conformity with claim 9, characterised by the fact that it comprises 2 pairs of different electrodes deposited on dielectric plates opposite the active part of the crystal to excite the said active part in an effective frequency reference mode and in an additional heating mode.

14. Oscillator, in conformity with claim 9, characterised by the fact that it comprises one pair of electrodes only deposited on dielectric plates opposite the active part of the crystal to excite the said active part in an effective frequency reference mode and in an additional heating mode, and characterised by the fact that the electrical circuits of the oscillator comprise filtering circuits to isolate the effective frequency reference component from the electric signal applied to the electrode.

15. Oscillator, according to claim 1, an infra-red electromagnetic screen composed of an insulation material thermally covered with a layer of reflecting material, disposed inside the insulating container and surrounding the whole piezoelectric resonator.

16. Oscillator, according to claim 1, characterised by the fact that the sealed container comprises a polished cover, covered on both sides with a layer of reflecting material.

17. Oscillator, according to claim 1, characterised by the fact that the electric connections between, firstly, the electrode deposited on the dielectric plates, and secondly, the electronic circuits of the oscillator, are raised to a temperature of the order of the crystal inversion temperature by an auxiliary heating device that consumes a power of the order of 10 milliwatts.

18. Oscillator, in conformity with claim 17, characterised by the fact that the auxiliary heating device makes use of the heat losses from the electronic circuits of the oscillator placed near to the sealed container of the piezoelectric oscillator.

19. Oscillator, in conformity with claim 1, characterised by the fact that it comprises an additional electric resistor for startup, disposed near to the sealed container.

20. Oscillator, according to claim 1 in which, one of the electrodes and the infra-red electromagnetic screens deposited on the dielectric plates and/or the support section of the crystal are at the same reference voltage.

21. Oscillator, according to claim 1, disposed in an atmosphere of which the temperature is very much less than the inversion temperature of the piezoelectric crystal.

* * * * *